United States Patent [19]

Beckmann

[11] Patent Number: 5,784,203

[45] Date of Patent: Jul. 21, 1998

[54] METHOD AND APPARATUS FOR COMBINING THE RADIATION OUTPUT FROM A LINEAR ARRAY OF RADIATION SOURCES

[76] Inventor: Leo H. J. F. Beckmann, Willem de Merodestraat 9, Delft, Netherlands

[21] Appl. No.: 759,366

[22] Filed: Nov. 26, 1996

[51] Int. Cl.$^6$ ................................................ G02B 27/10
[52] U.S. Cl. ........................................ 359/618; 359/629
[58] Field of Search ................................ 359/618, 629, 359/639, 640

[56] References Cited

U.S. PATENT DOCUMENTS

| | | | |
|---|---|---|---|
| 3,419,898 | 12/1968 | Baldwin et al. | 359/629 |
| 3,758,197 | 9/1973 | Klang et al. | 359/629 |
| 4,311,360 | 1/1982 | Hodson et al. | 359/618 |
| 4,329,629 | 5/1982 | Takayama | 315/323 |
| 5,048,946 | 9/1991 | Sklar et al. | 359/629 |
| 5,126,836 | 6/1992 | Um | 358/60 |
| 5,150,205 | 9/1992 | Um et al. | 358/60 |
| 5,243,619 | 9/1993 | Albers et al. | 372/97 |

*Primary Examiner*—David C. Nelms
*Assistant Examiner*—Ricky Mack
*Attorney, Agent, or Firm*—David P. Gordon; David S. Jacobson

[57] ABSTRACT

An optical concatenation element includes a stack of angularly offset plates of optical glass. Individual radiation beams arranged in a linear array, for example, from an array of laser diodes, are first manipulated by a series of optical elements so that the individual beams are collimated, given a spherical wavefront, and then focused in image space. Second, the beams are focused on the optical concatenation element and manipulated such that the beams are mutually aligned in the direction of low beam quality and thereby concatenated in the direction of high beam quality. The combined beam exiting the optical concatenation element is astigmatic, a quality which may be corrected by one or more optical lenses. The resulting beam is a substantially rotationally symmetrical laser beam of relatively higher radiant power.

25 Claims, 9 Drawing Sheets

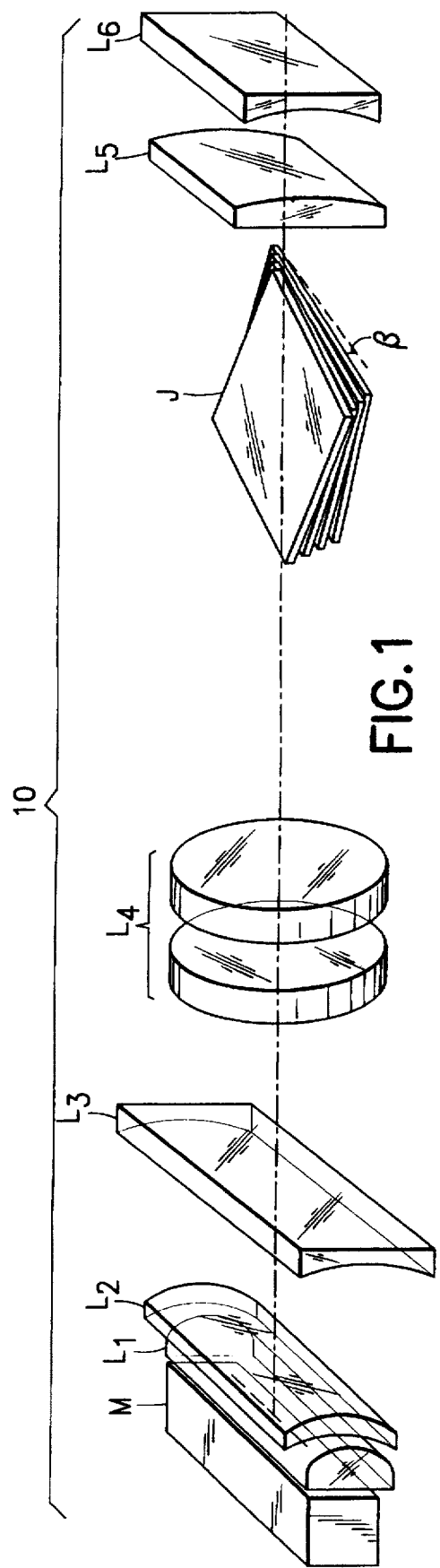
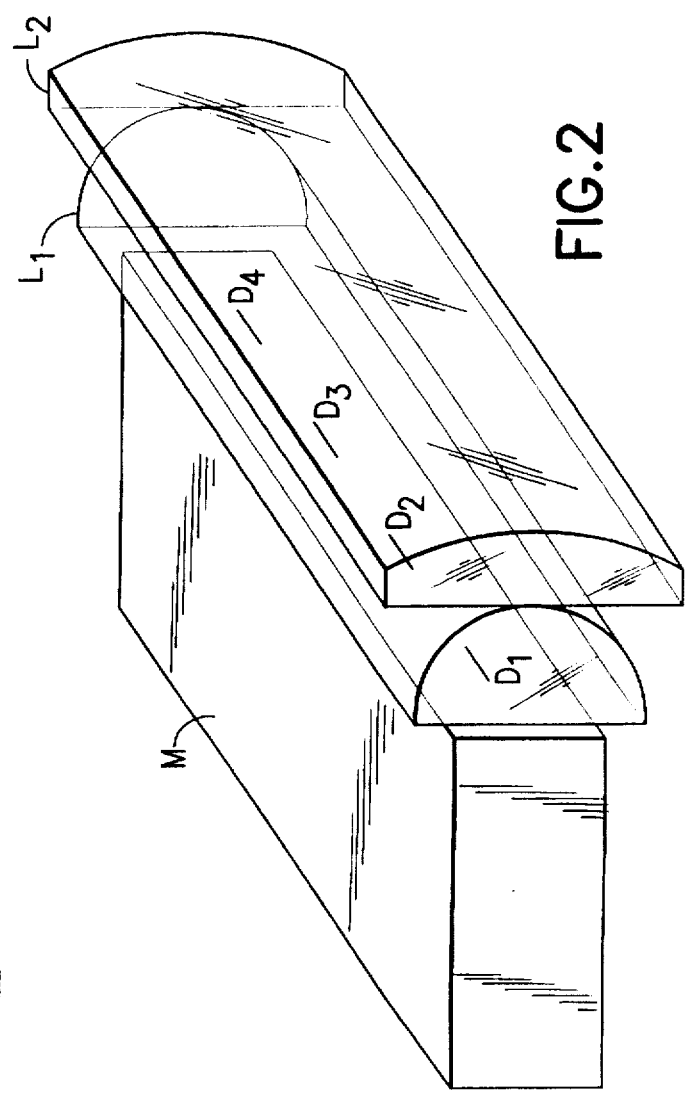
FIG.1
FIG.2

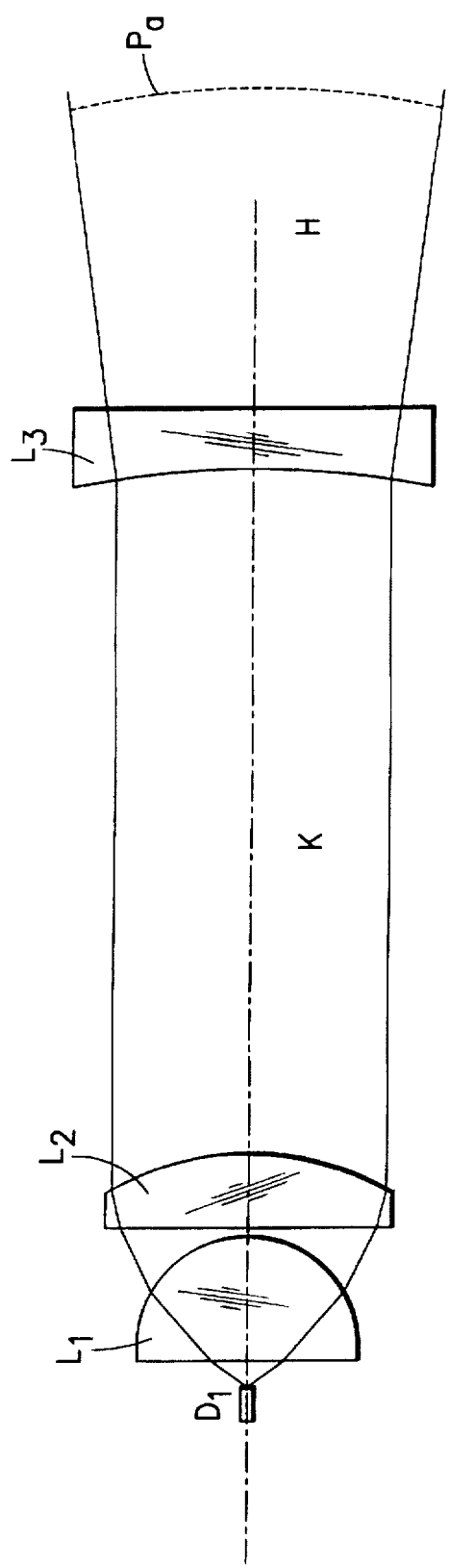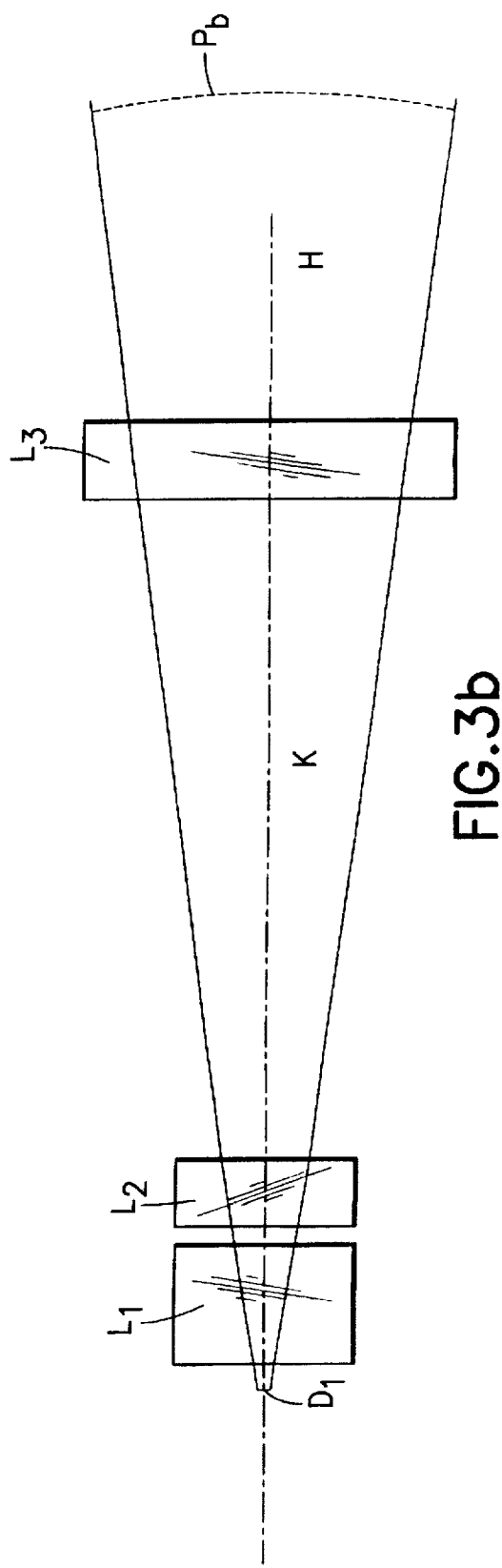

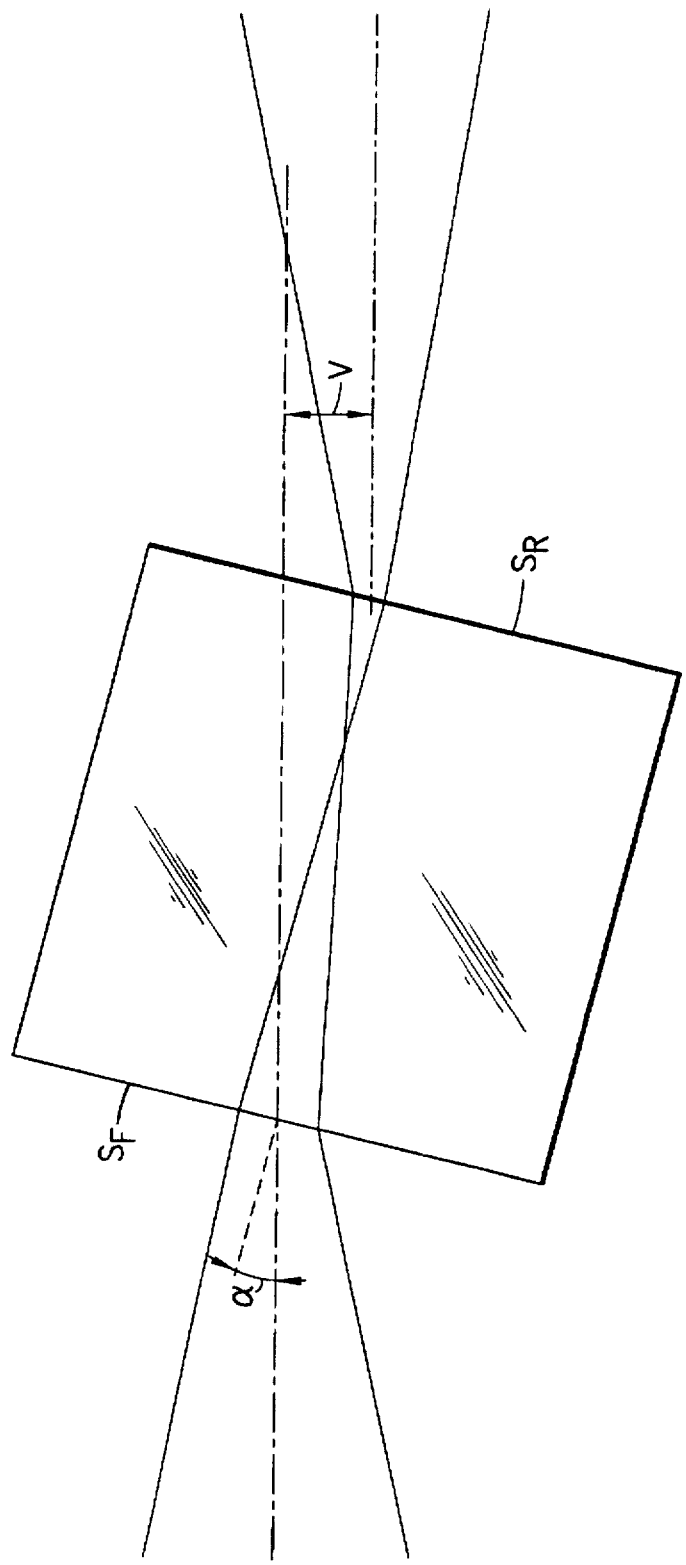
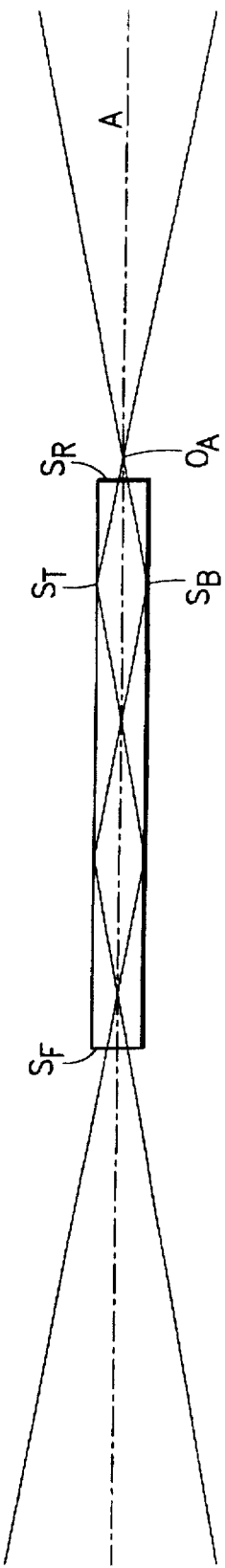
FIG.5
FIG.6

5,784,203

METHOD AND APPARATUS FOR COMBINING THE RADIATION OUTPUT FROM A LINEAR ARRAY OF RADIATION SOURCES

BACKGROUND OF THE INVENTION

1. Field of the Invention

This invention relates to optical elements for imaging several linearly arranged radiation sources. More particularly, this invention relates to an optical concatenation element which combines the radiant output from a linear array of radiation sources to form a common beam of radiation. The invention has particular application to combining the outputs of laser diodes, although it is not limited thereto.

2. State of the Art

Lasers have many uses, especially in the industrial and medical fields. For example, well known industrial applications for lasers include scoring and cutting metals, cutting and drilling solid materials (including semiconductors), and welding. In the medical field, lasers have been used in surgical procedures for cutting, cautery, the unblocking of arteries, and attaching of retinas, among other uses.

Diode lasers, or solid state lasers, are known optoelectronic components which convert electrical power into a laser beam. Diode lasers have a number of attractive features. Like all laser sources they constitute a radiation source of high radiance (i.e. radiant power per unit area and unit solid angle). They are also relatively efficient at converting electrical power into radiant power. However, since this conversion is associated with very high current densities in the diode material, diode lasers can only be built in small sizes, typically less than one millimeter, and accordingly have small output power levels. The power output from an individual diode laser is, in general, insufficient for applications such as the processing of materials, where often continuous powers of the order of hundreds or thousands of watts are required. For this reason there is a strong interest in combining the outputs from multiple diode lasers into one common radiation beam, in order to meet the total power requirements of industrial and medical applications and, at the same time, preserve the attractive features of the diode laser as mentioned above; particularly the high radiance.

Multi-element diode lasers are opto-electronic components in which many individual diode lasers are arranged in a common unit. Such components can deliver a total output power that naturally increases with the number of individual diode lasers, and are offered on the market by several manufacturers. The geometry of these components is such that the individual diodes form a linear array.

Combining the radiation output from a multi-element diode laser is made difficult by the geometry of the radiation beam emitted by each diode laser. The emitted beam from each diode in the array has strongly differing angles of divergence in two mutually perpendicular directions. A diode laser which delivers several watts of radiation will typically radiate into an angle of approximately 90 degrees in a first direction (perpendicular to the line in which the diodes are arranged) and into an angle of approximately only 10 degrees in a second direction (parallel to the line in which the diodes are arranged). At the same time, the quality of the radiation beam, i.e., the degree to which the beam size and angle of divergence approach that of an ideal or 'Gaussian' beam, is quite different for the two perpendicular directions. The beam has a higher quality in the direction in which it has the greater angle of divergence, and the beam has a reduced quality in the perpendicular direction thereto. As a result, it is desirable to combine the individual beams from multiple diode laser sources in a manner that concatenates or adds the individual beams together in the direction of strong beam divergence in order to create a common radiation beam having a high output power level.

U.S. Pat. No. 5,243,619 to Albers et al. discloses one manner of concatenating the radiation output from a linear array of radiation sources, particularly diode lasers. Each beam leaving the array of radiation sources is individually collimated, such that the beams do not overlap. The nonoverlapping beams are then individually rotated by individual high precision prisms, with one prism for each beam, such that the direction of high quality beam radiance is rotated by 90° for each beam. Finally, the rotated beams are combined with a spherical lens to form a single high power radiation beam. There are, however, significant shortcomings with the Albers et al. approach. First, extremely small lenses are needed to collimate the beams. Second, the collimation of the beams must be performed within a very small distance from the beam source; otherwise, the beams will widely disperse and the lenses will not be able to collimate the beams without the beams overlapping. Third, a separate high precision prism is required to rotate each beam. Fourth, the prisms are relatively expensive to manufacture. Finally, extremely high precision is required to assemble the lens system and linear array of diodes in order to result in a single high power radiation beam.

SUMMARY OF THE INVENTION

It is therefore an additional object of the invention to provide an optical system which will combine relatively lower power radiant beams emitted by lasers into a combined high power radiant beam.

It is another object of the invention to provide an optical system to manipulate individual diode laser beams to effectively concatenate the beams in the direction of high beam quality.

It is a further object of the invention to provide an optical system which can image and concatenate overlapping laser beams.

It is also an object of the invention to provide an optical system which requires less precision to manufacture.

It is an additional object of the invention to provide an optical system which is easy and inexpensive to manufacture.

In accord with these objects which will be discussed in detail below, an optical system is provided where individual beams from a linear array of diode lasers are first manipulated by a series of optical elements so that the individual beams are collimated, given a spherical wavefront, and then focused in image space. The beams are then directed to the optical concatenation element of the invention which includes a stack of angularly offset plates of optical glass. The beams are manipulated by the optical concatenation element such that the beams are mutually aligned in the direction of low beam quality and concatenated in the direction of high beam quality. However, as the combined beam leaves the optical concatenation element of the invention it is astigmatic, having two apparent origins (one in the direction of high beam quality and one in the direction of low beam quality). Therefore, the beam is preferably corrected by lenses for the astigmatism so as to create an apparently rotationally symmetrical laser beam of high radiant power. With the optical system including the optical concatenation element of the invention a linear array of low power diode laser beams can be combined into a single radiant beam of high power.

According to one embodiment of the invention, each angularly offset optical plate of glass has straight parallel front and rear surfaces through which a radiant beam enters and exits. According to another embodiment of the invention, the front surface, the rear surface, or both surfaces of the plates are curved. According to yet another embodiment of the invention the front surface of the plates is not parallel to the rear surface. According to another embodiment of the invention the plates are elongate and flexible. The front and rear surfaces of one strip are parallel to the front and rear surfaces of the other strips of the stack and a central portion of each strip (between the front and rear surfaces) is angularly offset relative to the central portion of the other strips in the stack.

Additional objects and advantages of the invention will become apparent to those skilled in the art upon reference to the detailed description taken in conjunction with the provided figures.

BRIEF DESCRIPTION OF THE DRAWINGS

FIG. 1 is a schematic perspective view of the system of the invention utilizing the optical concatenation element of the invention;

FIG. 2 is a schematic perspective view of a multi-element diode laser;

FIG. 3a is a cross-sectional schematic view of a diode laser with three lenses;

FIG. 3b is a top schematic view of a diode laser with three lenses;

FIG. 5 is a top schematic view illustrating the optical behavior of radiation as the radiation interacts with an optical plate;

FIG. 6 is a side elevation schematic view illustrating the optical behavior of radiation as it interacts with an optical plate;

DETAILED DESCRIPTION OF THE PREFERRED EMBODIMENTS

Figure 4:
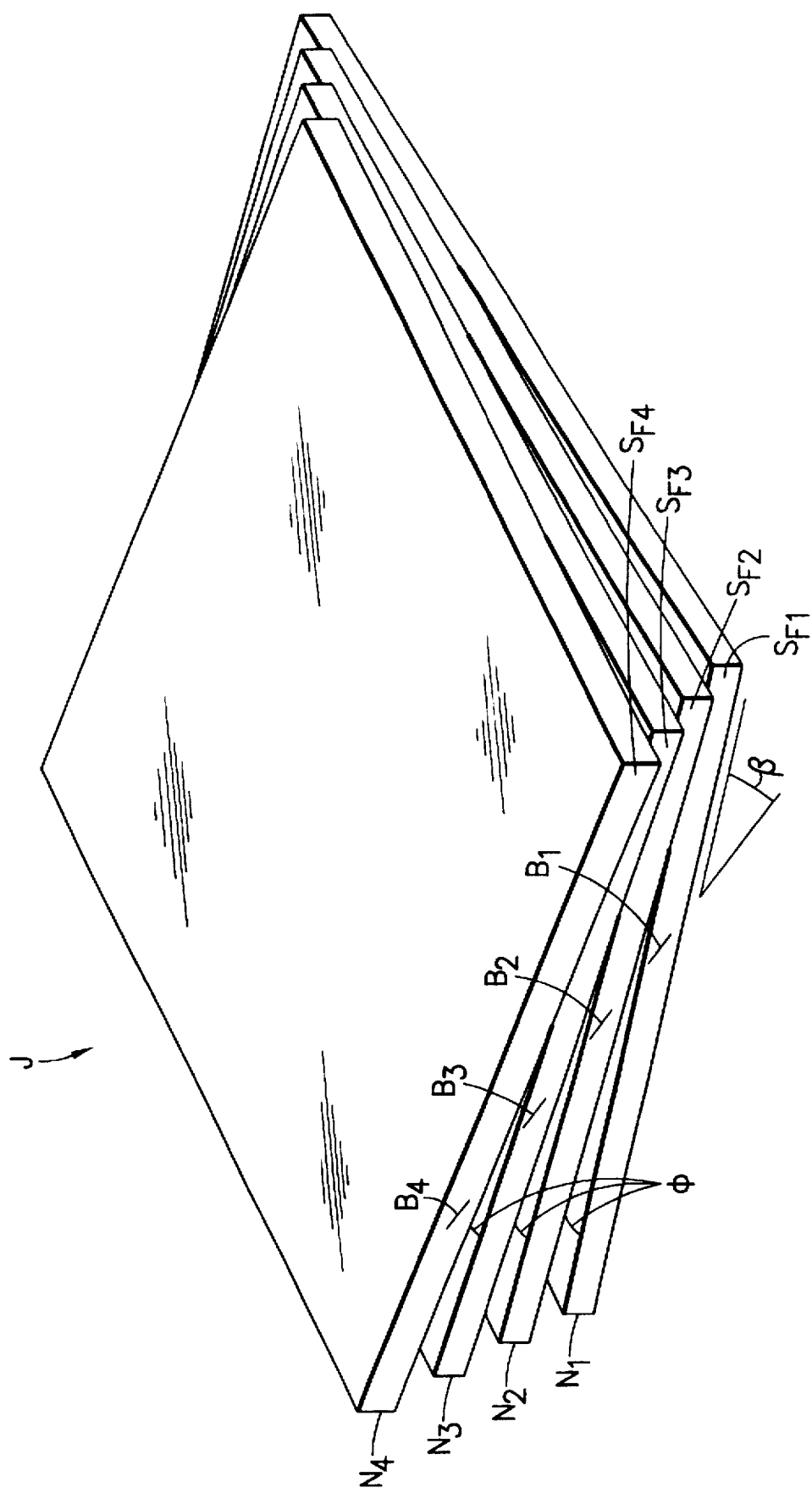
FIG. 4 is a perspective view of a first embodiment of an optical concatenation element of the invention.

Turning now to FIG. 1, the system 10 of the invention is shown. System 10 includes a multi-element diode laser device M where, for clarity, only four diodes have been illustrated and denoted $D_1$ through $D_4$. Adjacent to the diode laser device M, on the side from where the radiation is emitted, two cylindrical (non-centrically imaging) optical lens elements L1, L2 are oriented parallel to the linear array of diodes, as illustrated. Referring to FIG. 3a, which represents a cross-section in the direction perpendicular to the linear array of diodes, strongly divergent radiation from the diode lasers is refracted at the lens surfaces and forms an essentially collimated beam in the region indicated by K. FIG. 3b illustrates, with respect to one diode laser $D_1$, the refraction in the plane parallel to the line of diodes. In the plane parallel to the line of diodes, the beam has low divergence at the diode $D_1$, and since the cylindrical lenses have no optical power in that direction, the divergence is essentially unaltered in the region K.

Referring to FIGS. 1, 3a, and 3b, a third optical lens L3 is located along the radiant beam path after the second lens L2. The third lens L3 has its axis parallel to the axes of lenses L1 and L2. The function of lens L3 is to make the beam, which is shown in FIG. 2a (and which is collimated in the region K), divergent by an amount which corresponds to the divergence of the beam in the perpendicular direction, i.e. the direction shown in FIG. 2b. More precisely, and using the terminology of geometrical optics, the position and power of lens L3 are chosen such that after passing through lens L3 the wavefront of the radiation beam has essentially the same curvature in both directions, and thus the shape of a sphere. This is symbolically indicated in FIGS. 3a and 3b by the dashed lines $P_a$ and $P_b$.

In FIGS. 3a and 3b the beam diameters in the region H appear closely similar for the two mutually perpendicular directions. However, the similarity of the beam diameters is not an essential property. Rather, the important feature of the optical arrangement shown in FIGS. 1 and 2 is that it transforms each beam emitted by a member of the diode laser array such that a spherical wavefront is generated ($P_a$ having the same degree of curvature as $P_b$).

The radiation which leaves lens L3 consists of as many beams as there are diode lasers. The beams overlap, but each beam has an essentially spherical wavefront and, because of this, each beam is optically equivalent to a cone of radiation emitted by a point source. Referring back to FIG. 1, such radiation can be imaged by a lens or other optical imaging system L4, resulting, in image space, in a real image of the linear array of diode lasers, with well separated individual foci, one for each laser source. By proper selection of the focal length of the optical imaging system L4, the sizes of the individual foci can be varied over a wide range and still carry the full optical power of the corresponding diode laser source. However, the images have an important advantage over the original source in that the size of the focus and the associated angles of divergence of the radiation cones corresponding to that size can be adapted to subsequent optical processing to mutually align the beams.

Referring to FIGS. 1 and 4, a first embodiment of an optical concatenation element J is placed near the individual foci of the beams. The optical concatenation element J, the operating principle of which is depicted in FIGS. 4, 5, 6, and 7, consists of a stack of optical plates $N_1$–$N_4$ in which each individual plate is angularly offset by a certain angle $\phi$ from adjacent plates in the stack. The plates may be made from either glass or a composite material. The composite material is one that is optically transparent to laser radiation and has a sufficiently homogeneous refractive index, e.g., polycarbonate, PMMA, or polystyrene. Preferably, the plates $N_1$–$N_4$ are thin and substantially rectangular in shape. The front surface $S_{F1}$–$S_{F4}$ and the rear surface $S_{R1}$–$S_{R4}$ are parallel to each other. In addition, the top surface $S_{T1}$–$S_{T4}$ and the bottom surface $S_{B1}$–$S_{B4}$ are parallel to each other. All front, rear, bottom, and top surfaces of the plates $N_1$–$N_4$ are optically polished, and means are provided to ensure that radiation entering at the front surface $S_{F1}$–$S_{F4}$ will be totally reflected at the top surface $S_{T1}$–$S_{T4}$ and bottom surface $S_{B1}$–$S_{B4}$ when hitting these surfaces. From the geometry of plates $N_1$–$N_4$, it is evident that an optical ray which enters any plate $N_1$–$N_4$ at the front surface $S_{F1}$–$S_{F4}$ in an angular region close to the direction of the surface normal, will travel under an acute angle beam in the plate, and will be totally reflected at top surface $S_{T1}$–$S_{T4}$ and bottom surface $S_{B1}$–$S_{B4}$ if the refractive index of the material between the plates is just a little lower than that of the plates. This can be achieved by either allowing a small air gap between the plates or by coating at least one side of the plates with a layer of material having a suitable refractive index. The air gap is preferable, as an air gap is the easiest manner of ensuring total refraction. A coating may also be used, in which a layer of reduced refraction index glass or other material is deposited on the plate, for instance by evaporation or chemical deposition, as is well known in the art. It will be appreciated that while only four plates $N_1$–$N_4$ have been shown for the purpose of clarity, tens or hundreds of such plates may be stacked in the optical concatenation element if desired.

The optical behavior of an individual plate of the stack is elucidated in FIGS. 5 and 6. FIG. 5 shows a plate with a front surface $S_F$ parallel to a rear surface $S_R$. When a beam of radiation enters a plate having parallel front and rear surfaces $S_F$, $S_R$, which are angled at an angle $\alpha$ relative to the radiation beam will be refracted twice and leave the plate such that the axis of the beam is laterally shifted by a distance V. The distance V depends on the refractive index of the plate material and on the angle $\alpha$, and is further proportional to the distance between the front surface $S_F$ and the rear surface $S_R$.

FIG. 6 shows the behavior in an individual plate of a beam of radiation in the direction perpendicular to the front surface $S_F$ and rear surface $S_R$. Due to repeated total reflection, the radiation is 'trapped' within the confines of the top surface $S_T$ and bottom surface $S_B$. The exiting beam A of radiation will have an apparent origin $O_A$ near the rear surface $S_R$, but its angle of divergence will be very nearly equal to that of the incident beam at the front surface $S_F$.

Figure 7:
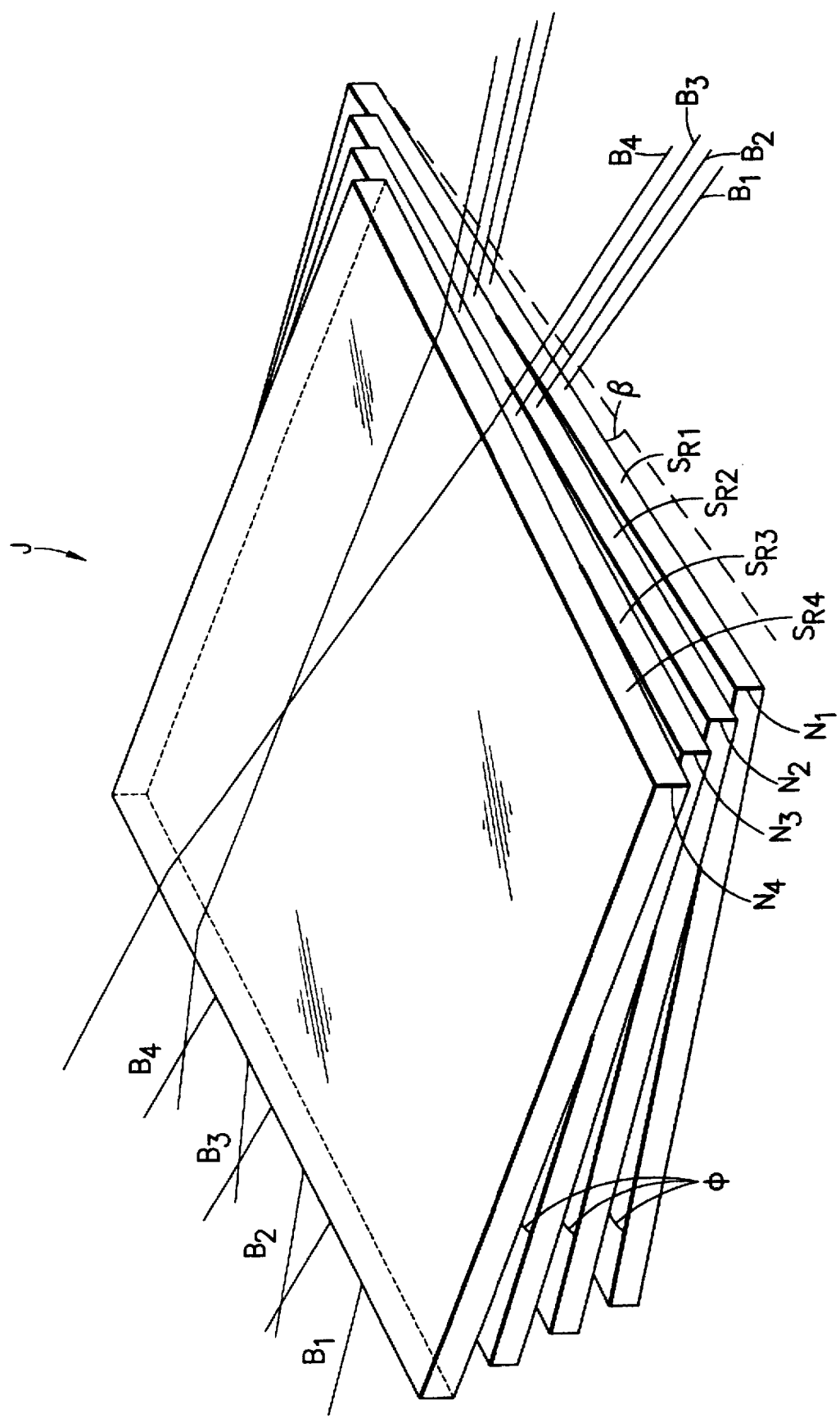
FIG. 7 is a perspective view of the invention illustrating the manner in which several radiant beams are concatenated by the first embodiment of the optical concatenation element.

FIGS. 4 and 7 show how the optical properties of thin plates, as illustrated in FIGS. 5 and 6 and described above, are utilized in the invention. Using principles known in the art, each plate $N_1$–$N_4$ in the stack of plates is angled at an angle of rotation $\phi$ relative to an adjacent plate, such that it creates a specified axial offset (V in FIG. 5). The optical images of the diode lasers $D_1$–$D_4$, which are obtained in the manner described above, are projected onto the front sides $S_{F1}$–$S_{F4}$ of the plates $N_1$–$N_4$ of the optical concatenation element J such that each plate is associated with exactly one diode laser beam $B_1$–$B_4$. To achieve this, it is necessary to have the line along which the images are formed tilted by a certain very small angle $\beta$ (e.g. 0.1°–10°) with respect to the direction of the plate surfaces (FIGS. 1 and 4). As shown in FIG. 7, light beams $B_1$–$B_4$ enter the optical concatenation element J from the left side of the drawing and exit on the right side of the drawing. By proper choice of the offset angles of rotation $\phi$ of the plates, it can be assured that the radiation beams $B_1$–$B_4$ which leave the rear surface $S_{R1}$–$S_{R4}$ of the plates are substantially mutually aligned on top of each other. It will be appreciated that in reality, the beam will be negligibly misaligned due to angle $\beta$. With the exception of angle $\beta$, this is the desirable direction of beam concatenation. (While not shown in FIG. 7, for purposes of clarity, it will be appreciated that the radiation beams leaving the rear surface $S_R$ will also have an angle of divergence, in the direction of high beam quality, perpendicular to the rear surface $S_R$, as shown in FIG. 6.)

Still referring to FIGS. 4 and 7, the plates are drawn with relatively large thicknesses (for purposes of illustration only), which, in turn, make angle $\beta$ appear to be substantially larger than it actually is. It is easy to see, however, that the thickness of each plate needs to be only marginally bigger than the width of a diode laser beam in the direction perpendicular to the length of the diode array, and as a result, the angle $\beta$ can be very small. As this is also the direction of high beam quality, the diode laser images will, for any given angle of convergence at the image, have minimum size in this direction, provided that optical imaging system L4 has low optical aberrations. In an actual implementation the plate thicknesses will typically range between five and five hundred micrometers, and be much smaller than the plate widths and lengths.

By way of example only, and not by way of any limitation, the following working embodiment for an array of forty laser diodes is offered. In a typical implementation, the power of lenses L1, L2 and L3 are chosen such that the images of the array of the laser diodes are magnified by a factor of three in a first direction parallel to the array of diodes and by a factor of forty in the direction perpendicular to the first direction. Thus, the image size of the forty laser diodes, each having a radiating surface of 1 µm by 100 µm, and a separation of 100 µm in the first direction, will cover an area of 40 µm by 24 mm. The plates each have a thickness of 50 µm, and a stack of forty such plates will be 2 mm in height. The above described images are imaged on the front ends of the plates at an inclination such that the radiation from the first laser diode of the array hits the uppermost plate and that from the last laser diode hits the lowermost plate. In the present example, this will require an angle $\beta$ of 4.78 degrees. From the known geometrical-optical relations which govern the behavior of the beam in FIG. 5, the offset V can be derived. V is fully determined by angle $\alpha$, the axial length L, and the refractive index N of the material of the plate according to:

$$V = L \cdot \sin\alpha \left( 1 - \sqrt{\frac{1 - \sin^2\alpha}{N^2 - \sin^2\alpha}} \right)$$

For a maximum angle $\alpha=30°$ and $N=1.57$, $V=0.21$ L and for a given V, L is found to be 4.78V. The above derived image length (24 mm), multiplied by the cosine of $\beta$, requires an offset of 11.96 mm to each side, and this is obtained by plates with an axial length of 57.16 mm at a maximum rotation of 30°. The plates would typically be 40 mm wide.

The stack of plates will only function in accord with the optical imaging system if the diode lasers are focused by lens system L4 to enter respective front surfaces $S_{F1}$–$S_{F4}$ of the plates. As the beams will diverge inside the plates only in the direction depicted in FIG. 5 (but not in the direction depicted in FIG. 6, due to reflection) the exiting combined beam is strongly astigmatic. This means that the center of curvature of the common wavefront in the plane parallel to the plates lies deep inside the stack, whereas the center of curvature of the wavefront in the plane perpendicular lies near the rear sides of the plates. According to the invention, if desired, the beam may then be further manipulated to compensate for this astigmatism so that the beam behaves like a radiant beam originating from a single source with essentially rotationally symmetrical output.

Figure 8:
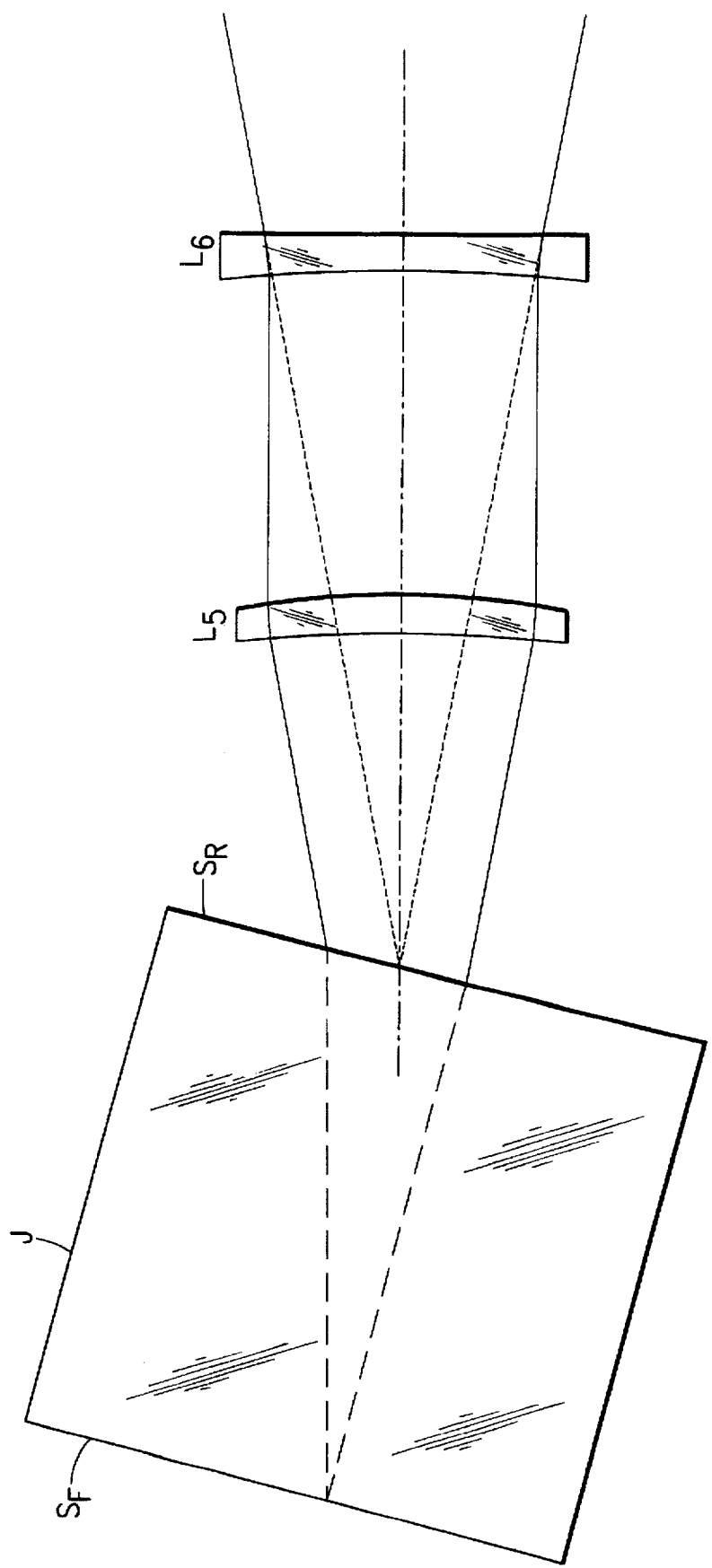
FIG. 8 illustrates the astigmatism of a radiant beam exiting the optical concatenation element for the invention.

Referring to FIG. 8, compensation for the astigmatism may be by a pair of cylindrical optical elements L5 and L6. Elements L5 and L6 have a mutual distance and are selected such that the apparent origin of the wavefront of the radiation is shifted by the desired amount for one direction along the optical axis relative to the perpendicular direction.

It will be appreciated that a thin stack of optical plates, functioning as described above, concatenates a linear array of diode laser beams in the direction of high beam quality, such that a plurality of closely adjacent aligned beams appears as a single rotationally symmetrical radiation beam.

It will also be appreciated that the parallel positioning of the front and rear surfaces $S_F$, $S_R$ is a necessary condition for the exiting beams to be parallel to the entering beams, i.e., for pure offset and no axial rotation, and for the exiting beams to have the same apparent origin $O_A$. In addition, this makes the system insensitive to a lateral shift of the plates of the stack. However, it is conceivable that a well defined deviation from parallelism, which is an additional degree of freedom, might offer an advantage. For example, non-parallelism might provide a means for correcting a divergence of the axes of the beams which form the individual diode laser images. Compensation for the divergence can be accomplished by progressively varying the angle between the front surface and the rear surface in each plate of the stack. However, this solution has the disadvantage that the plates of the stack are no longer of equal size and shape.

Figure 9:
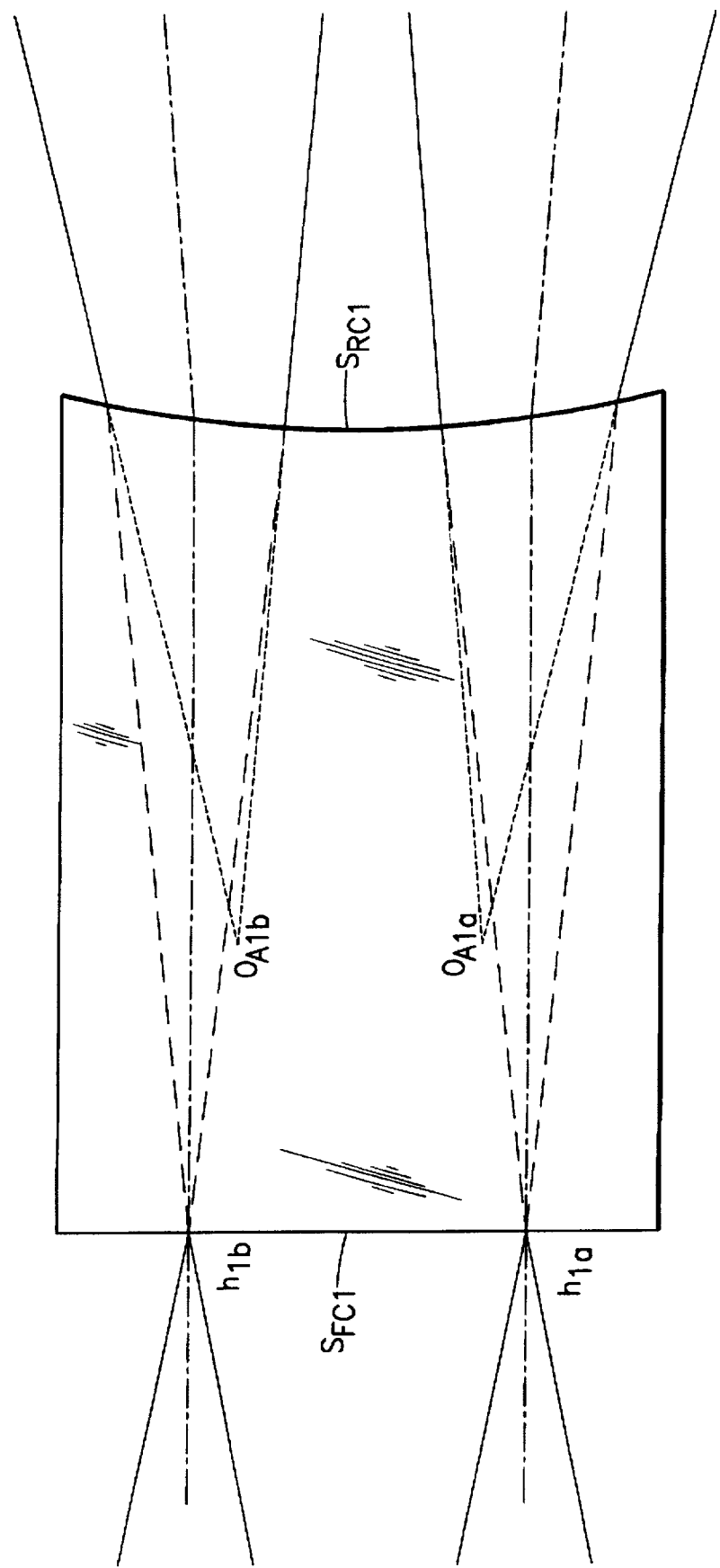
FIG. 9 is a top schematic view of the optical behavior of a radiant beam passing through a second embodiment of an optical concatenation element of the invention.

Turning to FIG. 9, a second embodiment provides a stack of plates having a potentially desirable additional degree of freedom, without the above noted disadvantage of plates having different shapes and sizes. Each plate in the stack has a shallow cylindrical (convex) shape given to either the rear surface $S_{RC1}$ (shown), front surface $S_{FC1}$, or to both surfaces, wherein the axis of the cylindrical shape is perpendicular to the top surface of the plates. The curved rear surface causes the direction of the axis of the exiting beam to depend upon the position of the originating laser diode within the array of diodes and the relation of the originating diode to the stack of plates. A laser beam entering a plate higher in the stack, for example at $h_{1a}$, will have an apparent origin $O_{A1a}$ and will be different from the apparent origin $O_{A1b}$ of a laser beam entering a plate lower in the stack, for example at $h_{1b}$. Such a stack of plates can be used to compensate for higher order deviations of the optical system occurring prior to when the laser beams are imaged on the stack of plates.

Figure 10:
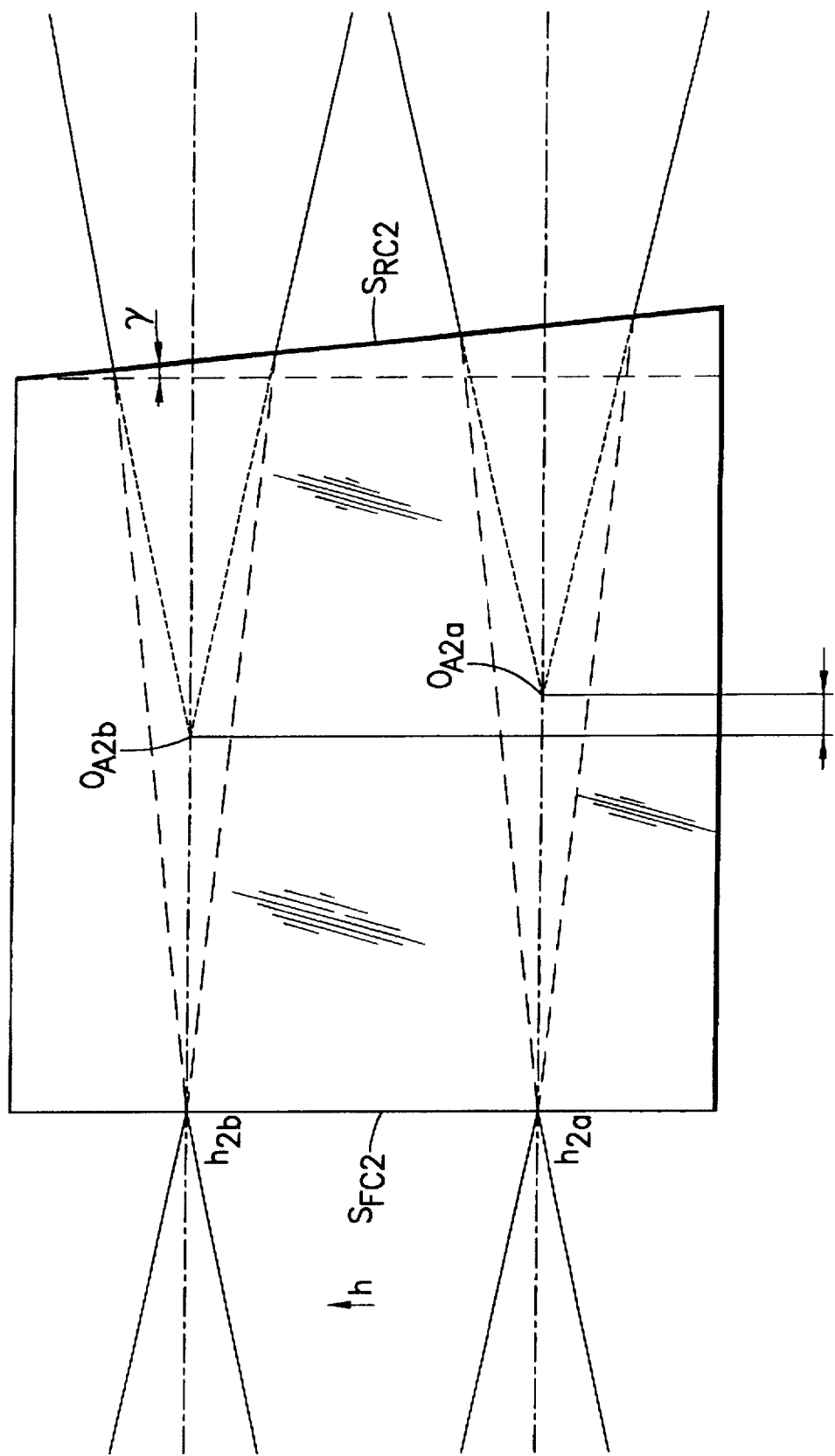
FIG. 10 is a top schematic view of the optical behavior of a radiant beam passing through a third embodiment of an optical concatenation element of the invention.

In a third embodiment, shown in FIG. 10, another apparatus and method are illustrated in which the stack of plates may compensate for higher order deviations of the optical system. Each plate is given an equal and small angle $\gamma$ between the front surface $S_{FC2}$ and the rear surface $S_{RC2}$, where the spatial position of angle $\gamma$ is such that the line of intersection of the front surface $S_{FC2}$ and rear surface $S_{RC2}$ to the top and bottom surfaces, respectively, remains perpendicular. Even though each of the radiation beams will be bent by the same amount, each will also travel a different axial length dependent upon the lateral position of the beam with respect to an individual plate. Therefore, the apparent origin $O_{A2a}$, $O_{A2b}$ of each exiting beam will vary according to the lateral position $h_{2a}$, $h_{2b}$ of the entering beam with respect to the front surface $S_{FC2}$ because of the change in axial length created by angle $\gamma$.

The above embodiments provide an optical concatenation element for the lateral shifting of radiation beams associated with a linear array of diode laser beams such that the beams are mutually aligned. In the first embodiment, this function is obtained from the mutual angular offset of the individual plates of optical glass of the optical concatenation element. Additionally, the second and third embodiments illustrate that a remaining degree of freedom could be used for example to finely adjust the exact direction of each individual beam to account for higher order deviations. In each embodiment the size and shape of the individual plates are preferably kept equal, thereby permitting easy and inexpensive construction of the optical concatenation element. Thus, the exact function of each individual plate of the stack is fully determined by the position of one of the corners of that plate and the angle of one of its sides in a suitably chosen common system of coordinates. This fact can be utilized to advantage to construct a tool with staircase-shaped stops for assembling the thin plates of a stack in a straightforward manner, and with relatively low cost.

Figure 11:
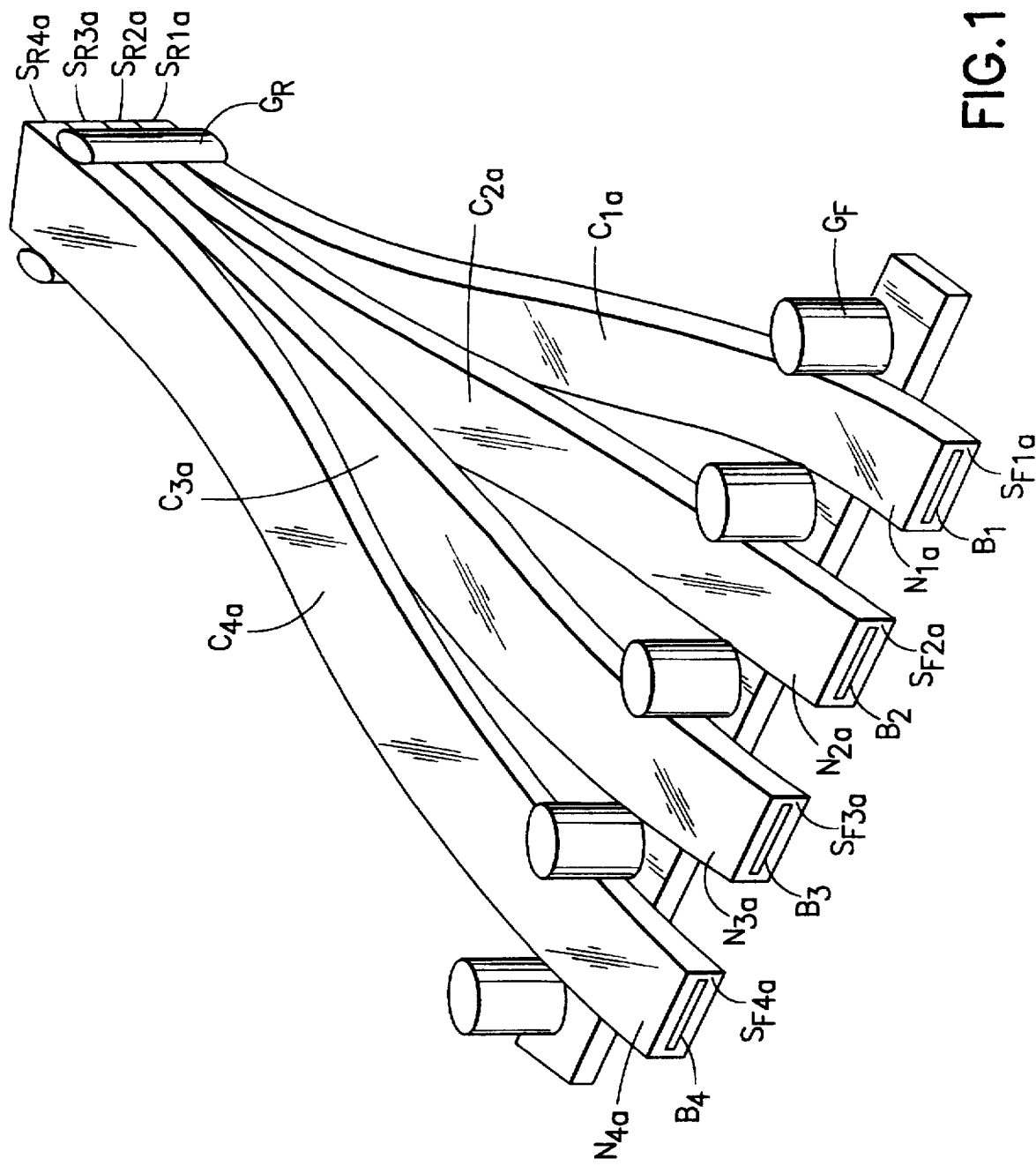
FIG. 11 is a perspective view of a fourth embodiment of an optical concatenation element of the invention.

Turning to FIG. 11, a fourth embodiment of an optical concatenation element of the invention is shown. The plates $N_{1a}$–$N_{4a}$ are each a flexible elongate strip of an optically transparent material, e.g., a flattened optical fiber. The width of each plate is approximately that of the size of the beam image $B_1$–$B_4$ of a laser diode $D_1$–$D_4$ as it enters the plate. The front and rear surfaces $SF_{1a}$–$SF_{4a}$, $SR_{1a}$–$SR_{4a}$ of each of the plates in the stack are substantially parallel to each other and are further substantially parallel to the array of laser diodes $D_1$–$D_4$ (see FIG. 2). The front surfaces $SF_{1a}$–$SF_{4a}$ of the plates are spaced for respective alignment with the images $B_1$–$B_4$ from the individual diodes $D_1$–$D_4$, while the rear surfaces $SR_{1a}$–$SR_{4a}$ of the plates are in a substantially vertical alignment. Therefore, the plates are bent such that a central portion $C_{1a}$ of one plate $N_{1a}$ is angularly offset relative to the central portions $C_{2a}$–$C_{4a}$ of the other plates $N_{2a}$–$N_{4a}$. In addition, the plates bend upward or downward, as the position of each plate within the stack requires, so that the front surfaces $SF_{1a}$–$SF_{4a}$ are preferably linearly arranged with the array of laser diodes. It is preferable that the front surface of each plate is angularly aligned to receive the entire beam image $B_1$–$B_4$ head on. Preferably the plates are of substantially equal length. One manner of organizing plates of equal length is to align the front surfaces $SF_{1a}$–$SF_{4a}$ and have the individual plates extend rearward to varying points, depending upon the relative position of an individual plate within the stack; i.e., the rear surfaces $SR_{1a}$–$SR_{4a}$ of the plates are not aligned. Another manner of organizing the plates is to align the front surfaces and the rear surfaces. As such, the central portions $C_{1a}$–$C_{4a}$ of the plates loop out by varying degrees depending upon the relative position of a plate within the stack and distance between the aligned front and rear surfaces.

It will be appreciated that the fourth embodiment will operate similarly to the first embodiment, as a radiation beam entering a plate will be trapped within the plate in the horizontal and vertical directions (as similarly illustrated in FIG. 6), travel through the plate and exit with the other beams to form a combined beam having relatively higher power.

Preferably the plates extend through a front guide $G_F$ which provides the lateral separation required between the plates so that the front surfaces $SF_{1a}$–$SF_{4a}$ of the plates are aligned with the laser diodes. Preferably a rear guide $G_R$ is also used to substantially vertically align the rear surfaces $SR_{1a}$–$SR_{4a}$. Alternatively, the rear surfaces of the plates may be aligned by securely bundling the plates together adjacent to the rear surfaces. The guides are simple tools to force the plates into the required shape for radiation entry and exit as the plates are stacked. It will be appreciated that other manners of stacking the plates in proper alignment may also be used.

Preferably all surfaces of the plates are optically smooth. The bottom and top surfaces of the plates have a lower refractive index than the core of the plate to ensure total internal reflection. One manner of creating a plate having the appropriate optical characteristics is to extrude a glass preform having a core of a higher refractive index and a mantle of a lower refractive index.

By way of example, each elongate plate has a width of approximately 0.3 mm and a thickness of approximately 0.05 mm; i.e. the cross section of the plate is just large enough to accommodate the size of the laser diode image. The length of the plates in the stack is not critical and should be long enough to allow the plates to be coupled at a rear portion without undue strain to any individual plate.

There have been described and illustrated herein several embodiments of an optical alignment system and an element for aligning a linear array of low power laser beams, and a method of aligning a linear array of low power laser beams using the optical alignment system and element. While particular embodiments of the invention have been described, it is not intended that the invention be limited thereto, as it is intended that the invention be as broad in scope as the art will allow and that the specification be read likewise. Thus, while particular types of lenses have been disclosed with respect to the optical elements which collimate the beams, which give the beams a spherical wavefront, which focus the beams on the optical concatenation element, and which correct the resulting astigmatism, it will be understood that any optical element which can perform the respective function can likewise be used. For example, it is assumed that beam collimation is done with two cylindrical lens elements. This is for the sake of clarity and to elucidate the optical function. In a practical implementation one might consider a single suitably shaped cylindrical lens element or conversely a multi-lens arrangement. Likewise, lens L3 might actually consist of several lenses. Each of the cylindrical surfaces may further have a circular or a non-circular cross-section. This and other conceivable variations of the arrangement of lenses L1, L2, and L3 have as their only goal and criterion for use, collimating the individual beams and providing each beam with a spherical wavefront. The principles and methods of design for achieving this are known in the art. Also, while a particular example with laser diode sizes, plate sizes, and angles, etc., has been provided, it will be appreciated that the example is not to be viewed as limiting in any manner, as a plethora of different arrangements could have been provided as the example. In addition, while the plates are described as being of equal length, it will be appreciated that the plates may also have varying lengths, and the optical effects of the varying lengths may be corrected by complex lenses. It will therefore be appreciated by those skilled in the art that yet other modifications could be made to the provided invention without deviating from its spirit and scope as so claimed.

I claim:

1. An optical system for combining a linear array of radiation beams to form one common beam of radiation, each of said radiation beams of said array having a wavefront and an axis, said optical system comprising:
    a) optical transformation means for providing each radiation beam of said array with a substantially spherical wavefront;
    b) optical imaging means for focussing said radiation beams with substantially spherical wavefronts into non-overlapping images; and
    c) an optical concatenation element having a plurality of optical plates, each of said optical plates having an optically substantially smooth front surface, a rear surface, a top surface and a bottom surface, said plurality of plates arranged in a stack and having an angular offset from each other,
    wherein each radiation beam associated with said non-overlapping images is projected onto said front surface of only one of said plurality of plates, and wherein said angular offset is chosen such that the axes of the beams exiting said rear surfaces of said plurality of plates are substantially aligned in a single plane perpendicular to said stack, thereby substantially forming one beam of radiation.

2. An optical system according to claim 1, wherein:
    said stack is tilted with respect to the linear array of radiation beams.

3. An optical system according to claim 2, wherein:
    each of said plurality of plates has a thickness in the range of 5 to 500 micrometers.

4. An optical system according to claim 2, wherein:
    said plurality of plates are of equal size and of identical shape.

5. An optical system according to claim 2, wherein:
    each of said plurality of plates coated on at least one of said top surface and said bottom surface with a material of a refractive index smaller than the refractive index of each plate.

6. An optical system according to claim 2, wherein:
    said front surface is substantially parallel to said rear surface.

7. An optical system according to claim 2, wherein:
    said front surface and said rear surface are planar.

8. An optical system according to claim 2, wherein:
    at least one of said front surface and said rear surface are cylindrically curved such that the axis of said cylinder is substantially perpendicular to said top surface.

9. An optical system according to claim 2, further comprising:
    d) compensating means for compensating an astigmatism of the common beam of radiation exiting from said optical concatenation element.

10. An optical system according to claim 2, wherein:
    said optical transformation means comprises at least one cylindrically-shaped lens with at least one optical surface having a circular cross-section.

11. An optical system according to claim 10, wherein:
    said optical transformation means includes at least one cylindrical lens with a non-circular cross-section.

12. An optical system according to claim 2, wherein:
    each of said plates has said front surface skewed relative to said rear surface.

13. An optical system according to claim 1, wherein:
    each of said plates is elongate and flexible.

14. An optical system according to claim 1, wherein:
    each of said plates is provided with a central portion skewed relative to the other of said plurality of plates in order to provide said angular offset.

15. An optical system according to claim 1, wherein:
    said front surfaces of said plurality of plates are linearly arranged.

16. An optical concatenation element for use in an optical system having an array of laser diodes which emits a plurality of radiation beams, said optical concatenation element comprising:
    a plurality of optical plates arranged in a stack, each of said plurality of optical plates having a front surface, a rear surface, a top surface and a bottom surface, and each of said plates being angularly offset relative to an adjacent plate of said stack,
    wherein said optical concatenation element concatenates the radiation beams forms a substantially single radiation beam.

17. An optical concatenation element according to claim 16, wherein:

said plurality of plates are of substantially equal size and of substantially identical shape.

18. An optical concatenation element according to claim 16, wherein:

said front surface of each of said plurality of plates is parallel to said rear surface.

19. An optical concatenation element according to claim 16, wherein:

said front surface of each of said plurality of plates is skewed relative to said rear surface.

20. An optical concatenation element according to claim 16, wherein:

each of said plurality of plates coated on at least one of said top surface and said bottom surface with a material of a refractive index smaller than the refractive index of each plate.

21. An optical concatenation element according to claim 16, wherein:

each of said plates is elongate and flexible.

22. An optical concatenation element according to claim 16, wherein:

each of said plates is provided with a central portion skewed relative to the other of said plurality of plates in order to provide said angular offset.

23. An optical concatenation element according to claim 16, wherein:

said front surfaces of said plurality of plates are linearly arranged.

24. A method for combining a linear array of radiation beams to form one common beam of radiation, each of said radiation beams of said array having a wavefront, said method comprising;

a) transforming each of said radiation beams of said array such that each of said radiation beams of said array is provided with a substantially spherical wavefront;

b) imaging said substantially spherical wavefronts to form non-overlapping optical images of said radiation beams of said array; and c) aligning said non-overlapping optical images using an optical concatenation element having a plurality of optical plates, said plurality of plates arranged in a stack and having an angular offset from each other to combine said radiation beams of said array into a common radiation beam having an apparent point source.

25. A method according to claim 24, further comprising:

d) compensating for an astigmatism of the common beam of radiation exiting from said optical concatenation element.

* * * * *